United States Patent [19]

Coffey et al.

[11] Patent Number: 5,132,561

[45] Date of Patent: Jul. 21, 1992

[54] SWITCHING OF LOGIC DATA SIGNALS

[76] Inventors: John A. Coffey, 10 Orchard Coombe, Whitchurch Hill, Reading, United Kingdom, RG8 7QL; Hamid N. Ragheb, 31 Cannock Way, Lower Early, Reading, United Kingdom, RG6 4EF

[21] Appl. No.: 641,506

[22] Filed: Jan. 15, 1991

[30] Foreign Application Priority Data

Jan. 17, 1990 [GB] United Kingdom ............... 9001010

[51] Int. Cl.⁵ .................... H03K 17/16; H03K 17/76
[52] U.S. Cl. ................... 307/443; 307/242; 307/259
[58] Field of Search ............... 307/443, 239, 241, 242, 307/243, 244, 259

[56] References Cited

U.S. PATENT DOCUMENTS 4,742,249  5/1988  Alpaiwalla et al. ............ 307/259 X Primary Examiner—David Mis
Attorney, Agent, or Firm—Fleit, Jacobson, Cohn, Price, Holman & Stern

[57] ABSTRACT

A data switching device for use in controlling a D.C. coupled logic signal path for relatively low level data logic signals between coupled Emitter coupled logic devices having a signal input and a signal output, between which are diodes of reverse polarity connected in series wherein the device is inexpensive and solves the problem of high power dissipation. By coupling control potentials to at least the point between the two diodes and the output of the switch via potential dividers the diodes can be biased into a conductive condition allowing the transmission of logic level signals. Variation of the potentials in the divider network can be used to render the diodes non-conductive to block the signal path.

8 Claims, 3 Drawing Sheets

SWITCHING OF LOGIC DATA SIGNALS

BACKGROUND OF THE INVENTION

This invention relates to the switching of logic data signals, of the kind in which a change of logic state is represented by a change in potential of a predetermined magnitude.

The parallel interface standard for digital television equipment known as EBU 656 specifies Emitter Coupled Logic (ECL) signal levels, wherein a change of logic state is represented by a change between potentials of −0.8 v and −1.8 v. Therefore within digital television equipment it is often required to select between several of these 8 bit wide parallel data busses for reasons such as input and output signal selection.

Within the ECL logic family there are devices which will serve as data selectors but they have the following disadvantages:

(a) expense relative to other logic families such as TTL or CMOS
(b) high power dissipation.

One solution to these problems is to level shift the incoming ECL data signals to TTL or CMOS levels within the equipment prior to processing the signal and to reconvert back to ECL level at the output. This can lead to implementation problems such as data to clock timing skews which leads to lack of noise immunity. For a simple system such as a 4 input to 2 output selector switch the cost of this solution is also high.

SUMMARY OF THE INVENTION

It is an object of the present invention to provide an improved data selector switching means that overcomes or alleviates one or more of the above-mentioned disadvantages.

The invention accordingly provides a data switching device comprising an input, an output, two diodes connected in series in a signal path between the input and the output, said diodes being connected in reverse polarity such that like poles of both diodes are connected to an intermediate point in said series signal path, and means for coupling at least said intermediate point and said output of the signal path to sources of biasing potential, the arrangement being such that the relationship between the biasing potentials at said intermediate point and said output can be varied between a first state, in which both diodes are biased into a conducting condition and a given variation in signal potential at said input causes a like variation at said output, and a second state in which the signal path between said input and said output is interrupted.

A switching arrangement in accordance with the invention thus provides a simple diode switch matrix which is of low cost and uses low power but which is capable of switching data logic signals such as signals at ECL level, without any level conversion.

Further preferred features of the invention and corresponding advantages thereof will become apparent from the following description taken in conjunction with the drawings and the claims.

BRIEF DESCRIPTION OF THE DRAWINGS

The invention is illustrated by way of example in the drawings in which.

DETAILED DESCRIPTION OF THE PREFERRED EMBODIMENTS

Figure 1:
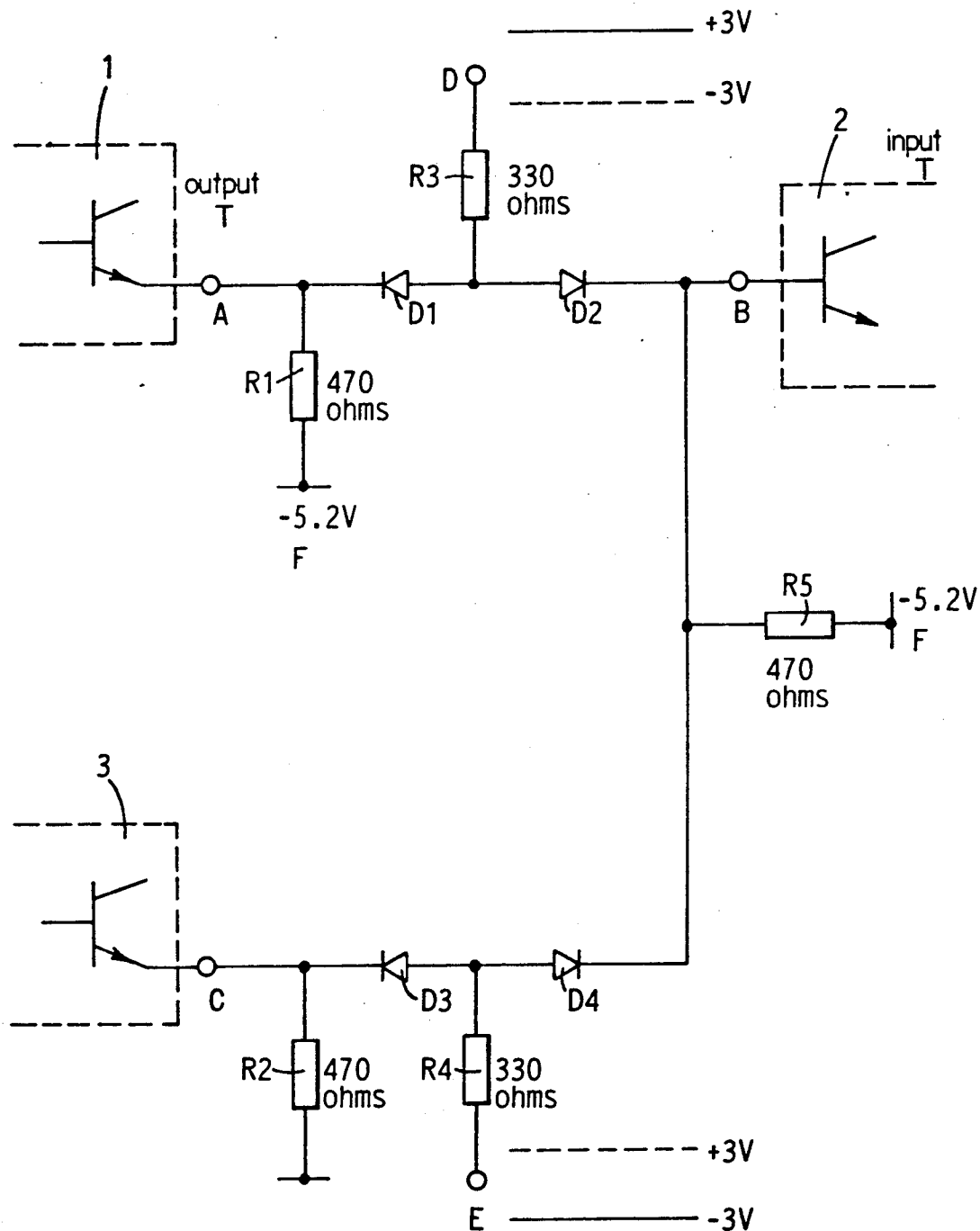
FIG. 1 is a circuit diagram of one embodiment of switching device in accordance with the invention
Figure 2:
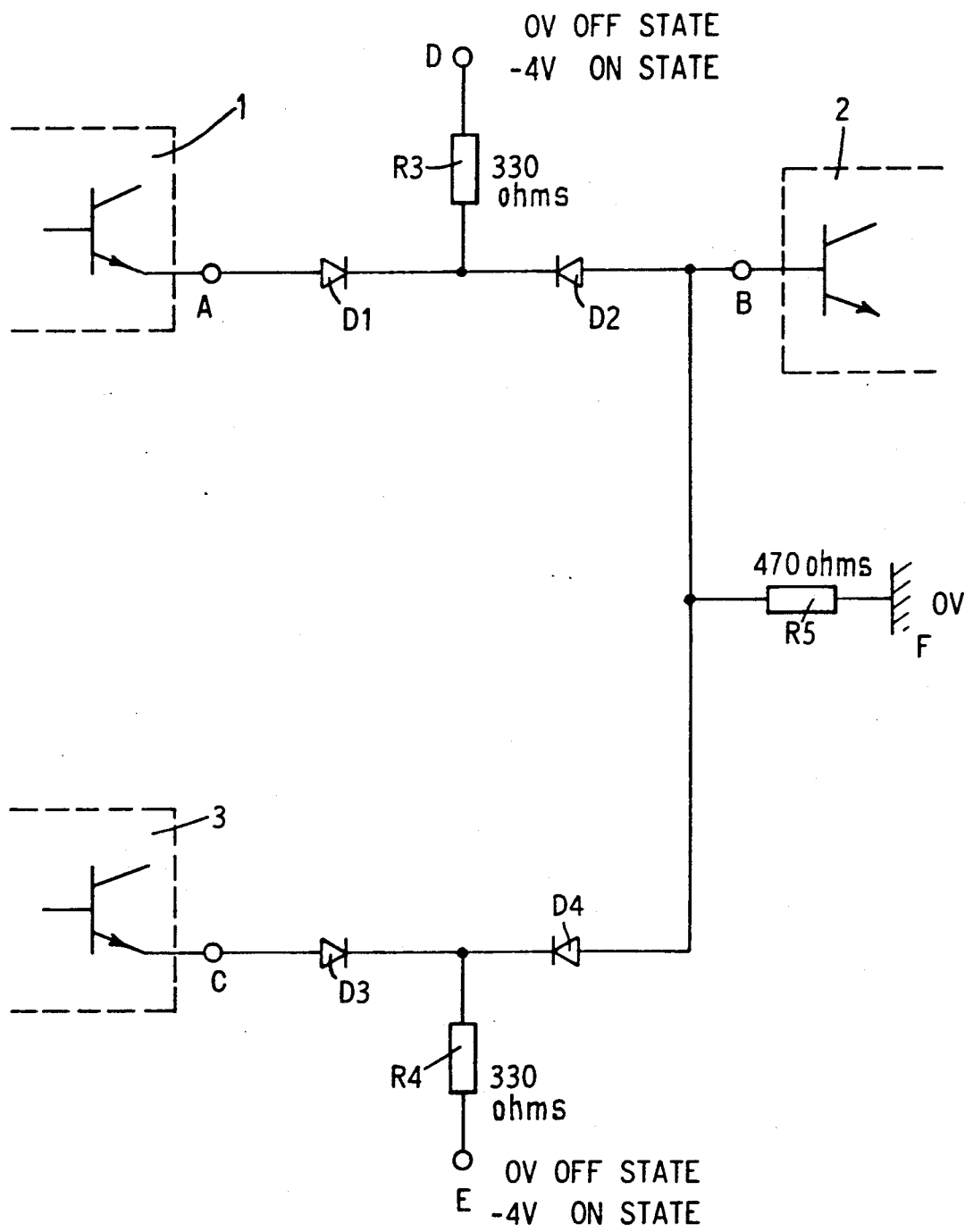
FIG. 2 is a circuit diagram of a further embodiment of switching device in accordance with the invention.
Figure 3:
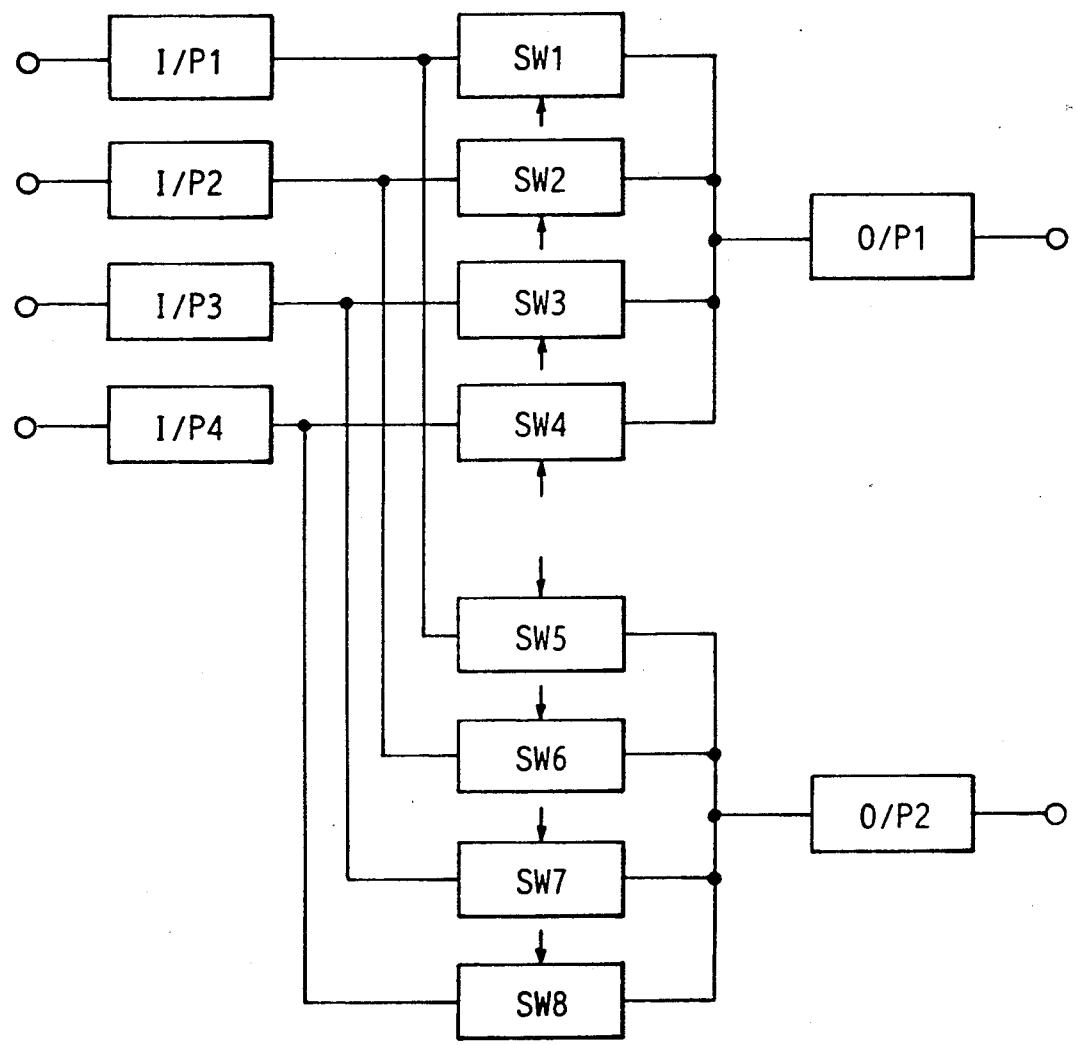
FIG. 3 is a block circuit diagram illustrating a selector switching matrix capable of being formed by the devices of FIGS. 1 and 2.

Referring to FIG. 1 there is shown a switching device for use in switching a signal path between an output transistor illustrated diagrammatically at 1, of one stage of equipment and an input transistor illustrated diagrammatically at 2 of another stage of equipment. The transistors 1 and 2 form parts of apparatus adapted to operate at ECL logic levels, i.e. wherein a change in logic state is represented by a swing in signal potential between levels of −0.8 v. and −1.8 v. The device in accordance with the invention thus provides a signal path between an input A coupled to the emitter of transistor 1 and an output B coupled to the base of transistor 2. Between the input A and output B there are connected in series two signal diodes D1 and D2 the anodes of which are connected together and to one side of a biasing resistor R3, the other side of which is capable of being coupled to two alternate sources of biasing potential, indicated at D.

The cathode of diode D1 is coupled to the input A and to one side of a biasing resistor R1, the other side of which is coupled to a source of biasing potential F, whereas the cathode of diode D2 is likewise coupled to the output B and one side of a biasing resistor R5 the other side of which is coupled to the same source of biasing potential F.

In the illustrated embodiment the source D is capable of being switched between levels of +3 v and −3 v whereas the source F is maintained at −5.2 v, and the biasing resistor R3 has a value of 330 ohms, whereas the biasing resistors R1 and R5 each have values of 470 ohms. It will thus be seen that when the source D is at +3 v the resistors R3, R1 and R5 form a potential divider network such that, allowing for the voltage drop across each of the diodes D1 and D2, both the input A and output B of the switch are biased to a voltage level of approximately −0.8 v in the absence of application of any other signal potential. The voltage drop provided by the potential divider network is thus such as to hold both of the diodes D1 and D2 in the conductive state so that when the transistor 1 causes a change in logic potential of from −0.8 v to −1.8 v at the input A, the same logic level change will be reproduced at B without attenuation. However, when the biasing potential D is switched to a level of −3 v the voltage drop in the potential divider network R3, R1 and R5 will not be sufficient to maintain the diodes D1 and D2 in a conductive state, and thus the signal path between input A and output B will be blocked.

A further signal path, equivalent to that described above is provided between a transistor 3 and transistor 2, the signal path between the corresponding points C and B like-wise including diodes D3 and D4 and being coupled to biasing resistors R2 and R4. The switching of the signal path is effected identically to that described above, and thus will not be described in detail. Suffice it to say that the two signal paths between points A and B and between points C and B can be switched into operation alternatively by applying a potential of +3 v at D, whilst applying a potential of −3 v at E, and vice versa.